United States Patent
De Felice et al.

(10) Patent No.: US 11,324,145 B2
(45) Date of Patent: May 3, 2022

(54) VENTILATION CONTROL APPARATUS AND METHOD

(71) Applicant: Schroff Technologies International, Inc., North Kingstown, RI (US)

(72) Inventors: Richard De Felice, Califon, NJ (US); David Therrien, North Kingstown, MA (US); Robert Paterson, Glasgow (GB); Henry Riddoch, Glasgow (GB)

(73) Assignee: Schroff Technologies International, Inc., North Kingston, RI (US)

( * ) Notice: Subject to any disclaimer, the term of this patent is extended or adjusted under 35 U.S.C. 154(b) by 0 days.

(21) Appl. No.: 16/417,874

(22) Filed: May 21, 2019

(65) Prior Publication Data

US 2020/0029459 A1    Jan. 23, 2020

Related U.S. Application Data

(63) Continuation of application No. 14/946,055, filed on Nov. 19, 2015, now Pat. No. 11,140,798.
(Continued)

(51) Int. Cl.
*H05K 7/20* (2006.01)
*F24F 11/30* (2018.01)
(Continued)

(52) U.S. Cl.
CPC .......... *H05K 7/207* (2013.01); *H05K 7/2059* (2013.01); *F24F 11/30* (2018.01); *F24F 11/62* (2018.01); *F24F 2011/0006* (2013.01)

(58) Field of Classification Search
CPC ....... H05K 7/207; H05K 7/2059; F24F 11/62; F24F 11/30; F24F 2011/0006
See application file for complete search history.

(56) References Cited

U.S. PATENT DOCUMENTS 4,094,166 A    6/1978  Jerles
4,362,026 A    12/1982 Miller
(Continued)

OTHER PUBLICATIONS

Stum, K. 1998. Using energy management control systems for HVAC operational diagnostics. Proceedings of the 11th Annual Symposium on Improving Building Energy Efficiency in Hot and Humid Climates, Ft. Worth, TX (Year: 1998).*

*Primary Examiner* — James J Lee
*Assistant Examiner* — Shon G Foley
(74) *Attorney, Agent, or Firm* — Armis IP Law, LLC

(57) ABSTRACT

An environmental control system for a telecom shelter integrates with a native HVAC system for exchanging interior air in a conditioned space in a machine room, telecom enclosure, or other closed machine environment by forcing or directing cooler outside air to replace interior air without active refrigeration by the native HVAC system. Primary cooling and heating of the conditioned space in the enclosure is performed by an exchange system and control logic that identifies, based on sensory input, when outside air exchange is more efficient than native AC (Air Conditioner) operation. The native AC system is suppressed or inhibited, and primary environmental control performed by fan driven exchange of outside air with air in the enclosure. Sensors and timers identify appropriate periods to defer control to the native AC system for cooling demand in excess of outside air exchange capability, and also identify ongoing suppression, or "takeback" of cooling control from the native system when erroneous, erratic or mistaken operation results in excessive or insufficient cooling, resulting from such factors as equipment failure, operator error, and environmental/disaster occurrences.

15 Claims, 5 Drawing Sheets

Related U.S. Application Data

(60) Provisional application No. 62/081,730, filed on Nov. 19, 2014, provisional application No. 62/081,727, filed on Nov. 19, 2014.

(51) Int. Cl.
*F24F 11/62* (2018.01)
*F24F 11/00* (2018.01)

(56) References Cited

U.S. PATENT DOCUMENTS

| | | |
|---|---|---|
| 6,062,482 A | 5/2000 | Gauthier et al. |
| 6,246,033 B1 | 6/2001 | Shah |
| 8,770,493 B2 | 7/2014 | Therrien et al. |
| 2005/0016189 A1 | 1/2005 | Wacker |
| 2005/0150968 A1* | 7/2005 | Shearer .............. G05D 23/1902 236/94 |
| 2006/0243904 A1 | 11/2006 | Ludwig |
| 2006/0248904 A1* | 11/2006 | Ludwig ................ B60H 1/3232 62/151 |
| 2007/0130976 A1 | 6/2007 | Akhehurst et al. |
| 2007/0194949 A1 | 8/2007 | Swarztrauber et al. |
| 2010/0080713 A1 | 4/2010 | Douglas et al. |
| 2011/0046790 A1* | 2/2011 | Miller ................... H04L 67/125 700/276 |
| 2012/0144850 A1 | 6/2012 | Hay |
| 2015/0083813 A1 | 3/2015 | Chen et al. |
| 2015/0180538 A1 | 6/2015 | Smith et al. |
| 2017/0292728 A1* | 10/2017 | Ushirosako ........ G05D 23/1932 |

\* cited by examiner

VENTILATION CONTROL APPARATUS AND METHOD

RELATED APPLICATIONS

This application is a Continuation (CON) of earlier filed U.S. patent application Ser. No. 14/946,055 entitled "VENTILATION CONTROL APPARATUS AND METHOD," filed on Nov. 19, 2015, which claims the benefit under 35 U.S.C. § 119(e) of U.S. Provisional Patent Application No. 62/081,727 filed Nov. 19, 2014, entitled "EQUIPMENT ROOM VENTILATION CONTROL," and U.S. Provisional Patent Application No. 62/081,730 filed Nov. 19, 2014, entitled "MACHINE ROOM HVAC SUPERCESSION CONTROL," the entire teachings of which are incorporated herein by this reference.

BACKGROUND

Electronic equipment generates heat as a by-product of electrical flow. As modern technology allows for more densely arranged elements such as memory and processors on circuit boards, the electrical consumption and corresponding generated heat increases. In a computer supported environment, electronic equipment such as computers, routers, switches and other telecommunications equipment is often stored in a "machine room" that has a separate ventilation, or HVAC (Heating, Ventilation and Air Conditioning) system than the rest of the building, office, or structure. However, modern proliferation of mobile devices requires controlled environment structures for on-site electronic switching and control equipment for telecommunications, such as machine rooms (telecom shelters) for housing switching equipment at cell phone towers, for example. Such machine rooms typically house a dense configuration of electronic equipment, since accommodation of human workers is generally not required except for occasional maintenance. HVAC demands of these small, specialized machine rooms are particularly specialized and intense due to the small conditioned space and significant heat generation capability of the equipment stored therein.

SUMMARY

A supplemental cooling system for a telecommunications equipment enclosure manages cooling resources for electronic equipment by identifying a thermostatic control to a native cooling resource directed to the telecommunication equipment enclosure, and interfacing with the thermostatic control for superseding the thermostatic control to enable and disable the cooling resource according to air exchange logic. Air exchange logic performs selective disabling, based on an interior temperature of the equipment enclosure and an ambient temperature outside the equipment enclosure, of the native cooling resource in favor of ambient air exchange with the equipment enclosure. The air exchange logic then monitors the interior temperature for determining when to re-enable the native cooling resource.

Upon disabling the native cooling resource, the air exchange logic sets an override timer, and evaluates, upon expiration of the override timer, continued suppression of the native cooling resource to determine if a transient or temporary condition has subsided. The air exchange logic determines whether the native cooling resource should be re-enabled to maintain adequate temperatures in the equipment enclosure, and if so, re-enables the native cooling resource. Such transient conditions include excessive compressor head pressure or frozen coils, for example, that if not mitigated as disclosed herein, could persist and exacerbate cooling problems or equipment overheating and failure.

Upon re-enabling the native cooling resource to commence cooling operations, the air exchange logic sets a takeback timer for reevaluating continued performance of the native cooling resource, and subsequently disables, if a condition resulting in the previous disabling of the native cooling resource persists, the native cooling resource, since the previous inhibiting of the native control according to the override timer may have not cured the problem or malfunction. The air exchange logic then continues management of the interior temperature using the ambient air exchange for mitigating high temperatures as much as possible until a more thorough diagnostic is available. Such air exchange, however, nonetheless exhausts heat and may provide adequate cooling, depending on the outside ambient temperature, and is certainly an improvement over the heat buildup that would otherwise occur in the closed machine room.

Configurations herein are based, in part, on the observation that controlled environment structures for electronic equipment often employ HVAC (heating/ventilation/air conditioning) equipment disproportionate to the air volume of an enclosure defined by the interior of the structure. These specialized installations are typically unattended and have HVAC systems sized for a worst-case scenario. Often, such an HVAC system has a capacity in excess of that required for sufficiently cooling the cubic foot volume of the enclosure. Unfortunately, conventional approaches to machine enclosure cooling suffer from the shortcoming that the native HVAC system cannot be effectively scaled based on demand, resulting in excessive cooling of the equipment enclosure. Therefore, such native HVAC systems may be governed by control equipment that is inefficient or wasteful in providing appropriate cooling to the enclosure, and in extreme circumstances may result in overcooling and/or overheating of the enclosure, placing sensitive electronic equipment at risk of damage from excessive operating temperatures.

Accordingly, configurations herein substantially overcome the above-described shortcomings by providing a system, method and apparatus for invoking an external air exchange with a conditioned space in the enclosure when doing so provides more efficient environmental and temperature controls for keeping the interior at an acceptable temperature. An override and takeback setting actively manage and control the native HVAC system to correct short term problems or anomalies and prevent ongoing inefficient operation using a takeback interval that assesses remedial measures for effectiveness.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
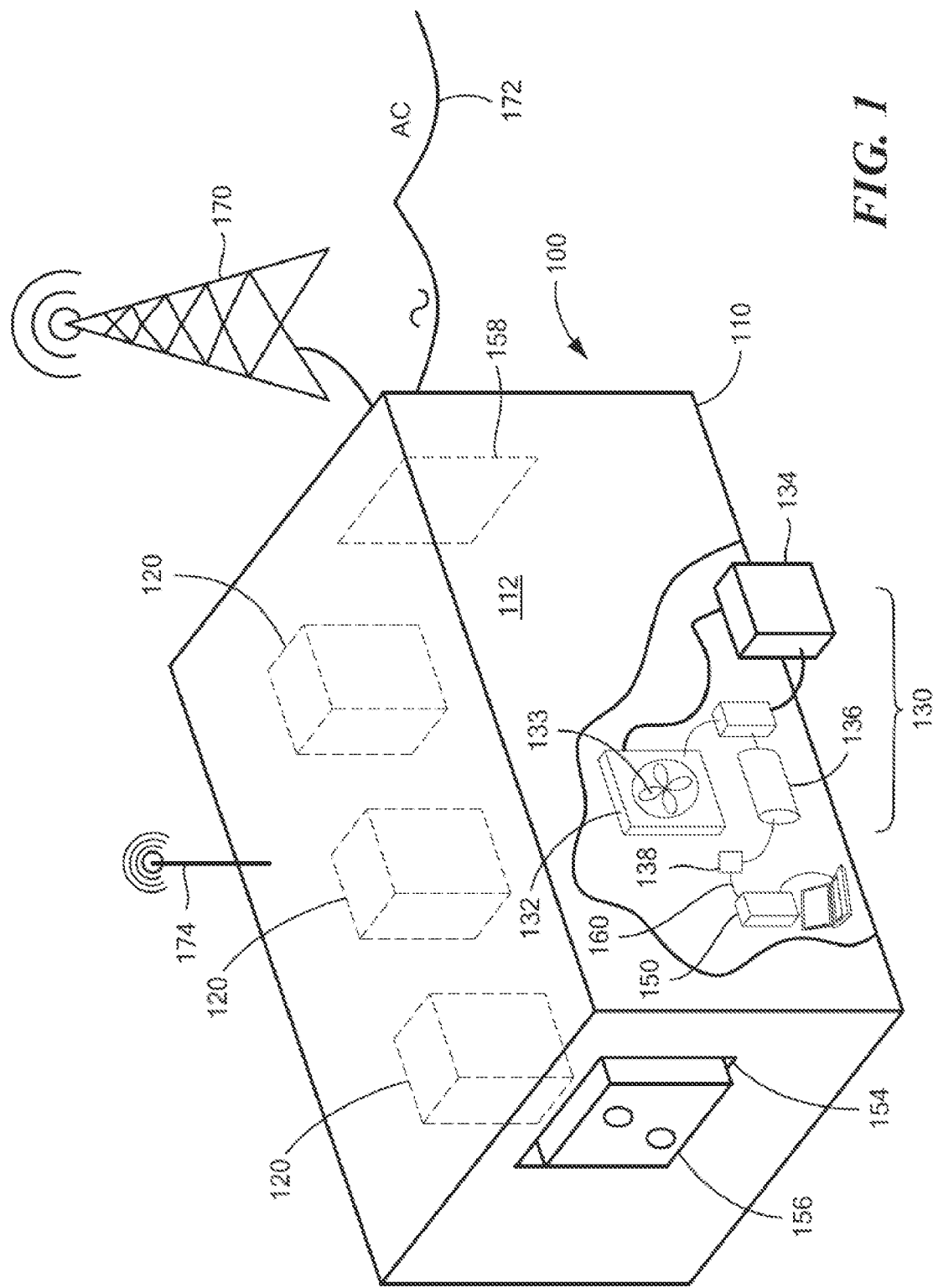
FIG. 1 is a context diagram of a telecommunications environment suitable for use with configurations disclosed herein.

Electronics equipment for telecommunications is often located at a transmission point defined by an antenna, cell tower, or an intermediate routing location. Small, specialized enclosures or machine rooms provide a protective, temperature controlled environment that is vital to continued operation of the equipment. Since such enclosures may be remote, and only periodically monitored by an on-site technician, a native control system for providing HVAC support is intended to provide autonomous operation. Further, due to the size and number of equipment enclosures, rigorous attention to HVAC systems serving individual enclosures presents a logistical challenge. Additionally, such shelters are built according to standard configurations that must account for worst case conditions including heat load, geography, condition of the HVAC (age degradation) and solar gain based on time of day and year and local shade casting elements such as buildings, trees, etc., that typically do not apply equally to all shelters. Accordingly, inefficient or underperforming installations may elude detection until outright failure, placing the equipment therein at risk. Configurations below provide a supplemental management and oversight approach that increases efficiency and longevity of the native control HVAC system, alerts as to functional deficiencies, and mitigates cooling shortfalls in the event of failure.

Environmental control of telecommunications (telecoms) enclosures benefits from the observation that substantial equipment cooling may often be achieved by ventilating with ambient air for replacing heated machine room air through a system of fans and louvers. One such approach is outlined in U.S. Pat. No. 8,770,493, filed Oct. 10, 2012, entitled "TELECOM SHELTER COOLING AND CONTROL SYSTEM." While not always applicable as an exclusive cooling approach, strategic use of ambient air exchange reduces the usage time and power cycles imposed on the native control. In the approaches discussed further below, supplemental air exchange is performed in conjunction with sensor based diagnostic and monitoring of the enclosure for overriding the native control in favor of ambient air exchange, and selectively inhibiting and enabling operation of the native control. In conjunction with air exchange logic for interpreting sensor data such as temperature and humidity, the native control is monitored in a supervisory capacity within certain predetermined limits of temperature and/or humidity. Intervention in response to detected inefficiency or operational problems disables the native control for mitigating a temporary malfunction or anomaly. The air exchange logic re-enables the native control, subject to a takeback of control if the detected inefficiency or malfunction persists.

In a typical operating scenario according to configurations herein, a controller having air exchange logic disables, based on an interior temperature of the equipment enclosure and an ambient temperature outside the equipment enclosure, the native cooling resource in favor of ambient air exchange with the equipment enclosure, and monitors the interior temperature for determining when to re-enable the native cooling resource. Upon disabling the native cooling resource, the air exchange logic sets the override timer and re-enables the native cooling resource. Suspending operation of the native control includes interfacing with a thermostatic circuit for overriding a thermostatic switch to disable the native control as described further below.

Following expiration of the override timer, the air exchange logic may conclude that the native control is capable of again maintaining the temperature within the predetermined limits, and re-enables the native control subject to a takeback timer. Upon expiration of the takeback timer, the air exchange logic again disables, if a condition resulting in the previous disabling of the native cooling resource persists, the native cooling resource.

The examples below depict several configurations, typically for cooling as equipment heat generation is a paramount concern, and provide a method and apparatus for implementing the proposed approach. Alternate arrangements of HVAC control, such as additional environmental sensors and circuits for interfacing with the native control, could be implemented according to the principles herein.

FIG. 1 is a context diagram of a telecommunications environment suitable for use with configurations disclosed herein. Referring to FIG. 1, in a telecommunications environment 100, an enclosure 110 houses a machine room 112 for storing and operating communications equipment 120, such as switching and routing equipment, power supplies, antenna amplifiers, and associated computers and processing devices. A HVAC system 130 provides the native control and includes an evaporator 132 and fan 133 for blowing cooled air, a compressor 136, a condenser 134 outside the enclosure, and a thermostat 138 or other control for switching the compressor 136 and other HVAC components. The cooling operation of the HVAC system 130 is generally the most used, to offset the high heat given off by the equipment 120.

A controller 150 in the enclosure 110 includes air exchange logic 152 (FIG. 2) in the form of a circuit and/or application, and operates the intake fan 154 and controls the HVAC system 130 via an interface 160 to the thermostat 138 for providing thermostatic control over the HVAC system 130. An intake vent 156 and output vent 158 isolate the machine room 112 when the intake fan 154 is idle, such as by louvers, gates, panels or other automated closures.

A telecommunications tower 170, such as a cell tower or TV/radio transmission beacon is responsive to the equipment 120 for throughput support, and AC lines 172 provide electrical power. A local antenna 174 provides Internet connectivity for the controller via WiFi or 4GL wireless links under IEEE 802.11 connectivity; alternatively a hardwired Ethernet cable or other Internet LAN may also be provided alternatively, form C contacts may be employed for communicating alarms and status.

Figure 2:
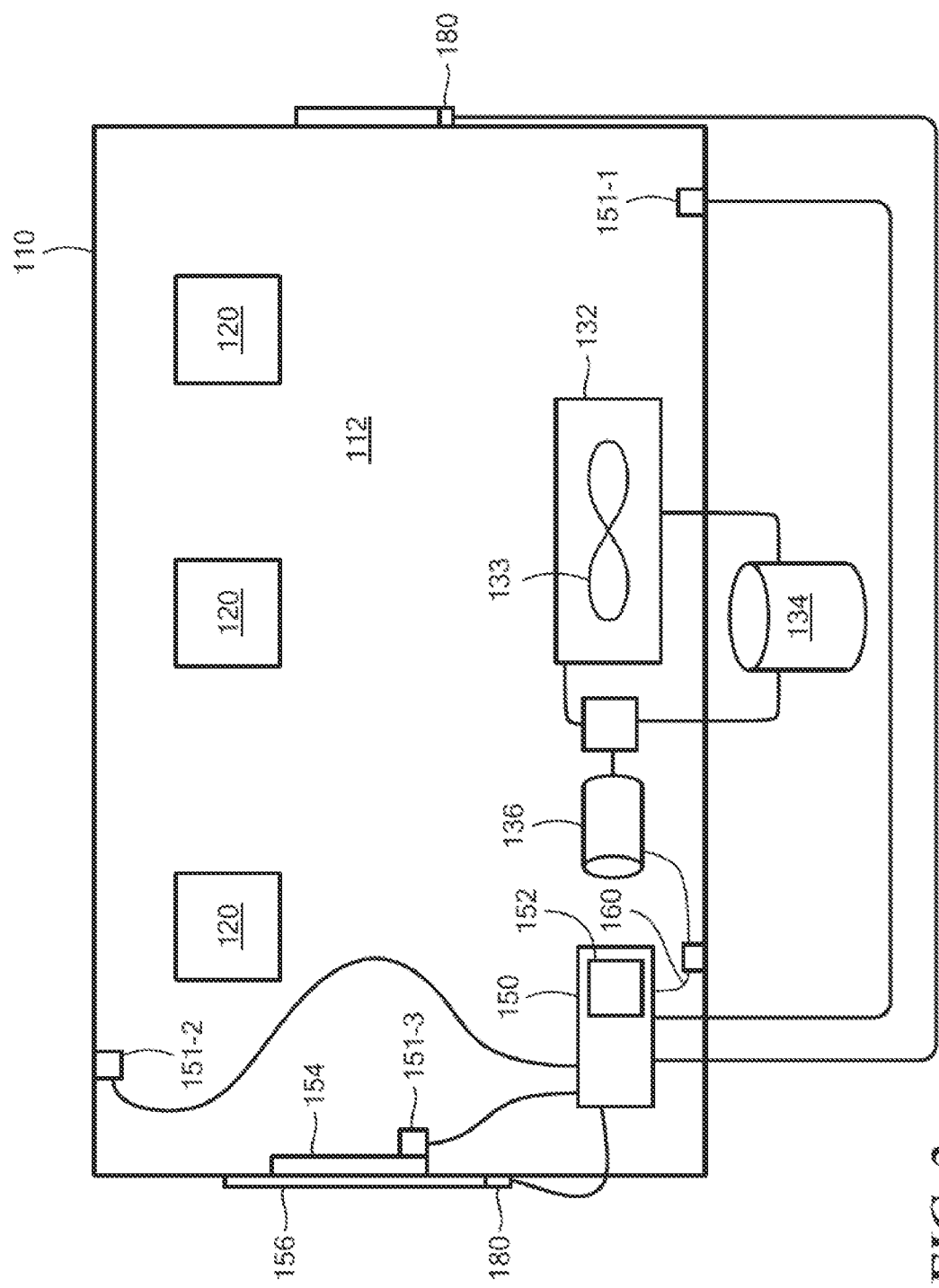
FIG. 2 is a plan view of an equipment enclosure in the environment of FIG. 1.

FIG. 2 is a plan view of an equipment enclosure in the environment of FIG. 1. Referring to FIGS. 1 and 2, an example machine room includes a native control HVAC system 130 having a single compressor 136 and thermostat 138. The controller 150 connects to the thermostat 138 via the interface 160, and also connects to temperature sensors (such as thermistors) 151-1 and 151-2, for sensing interior temperature in the enclosure 110, and 151-3 (151 generally) for sensing ambient temperature outside the enclosure 110. Note that outside air thermistor 151-3 may be disposed at the intake vent 156 to avoid running exterior wires through the enclosure 110 wall, and is coordinated with opening of the vent, discussed below.

Intake vent 156 and output vent 158 are also responsive to the controller 150, and coordinate with the intake fan 154 for exchanging ambient air. Alternatively, the intake fan 154 could be mounted as an exhaust fan, as long as an airflow path for ambient air is provided. Air exchange logic 152 in the controller 150 receives input from the thermistors 151 and the thermostat 138 for computing a current state and need for ambient exchange and control of the compressor 136 (native control), as discussed further below. Actuators 180 responsive to the controller 150 open and close the vents 156, 158.

Figure 3:
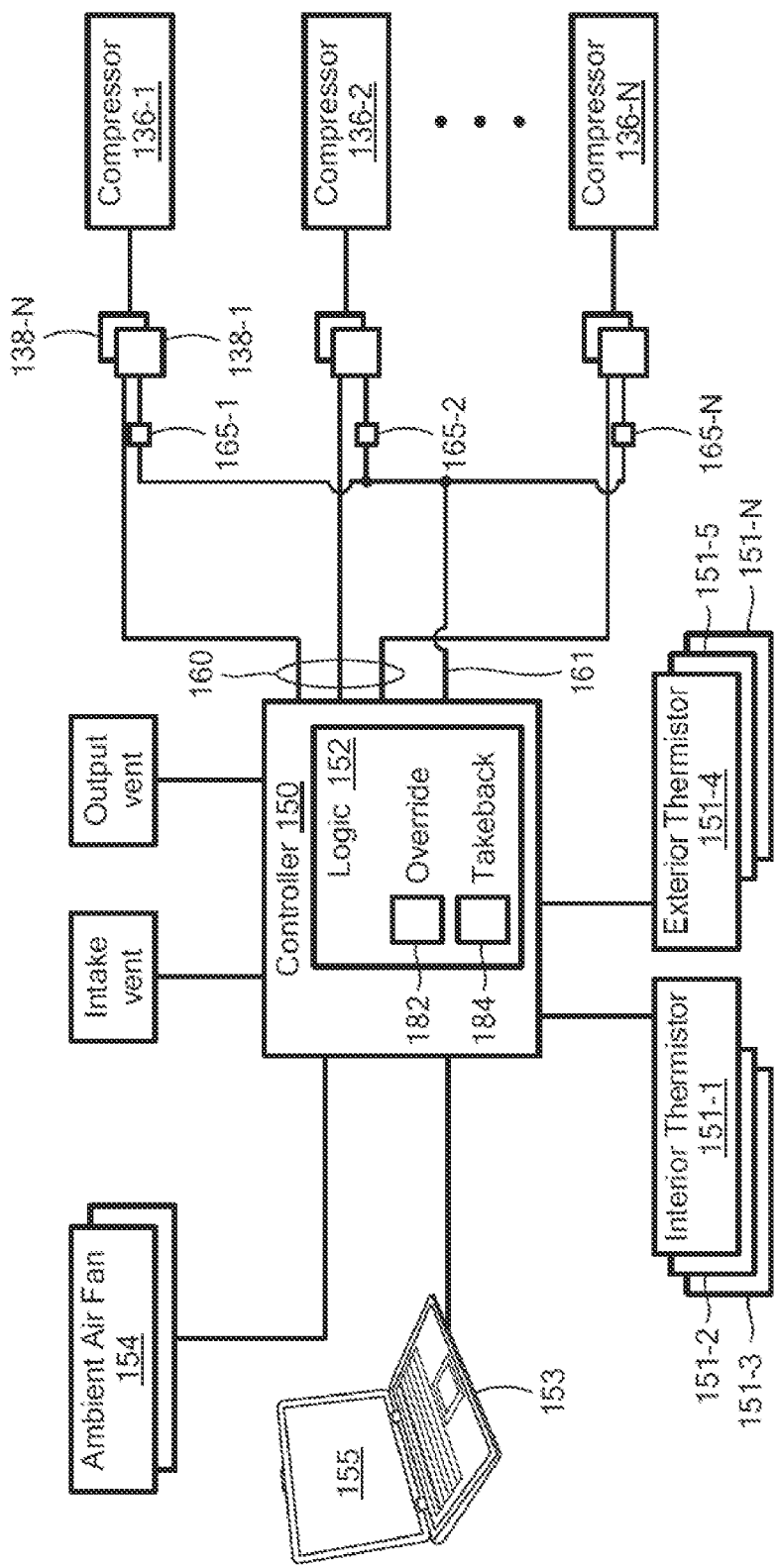
FIG. 3 is a block diagram of a configuration in an equipment enclosure as in FIG. 2.

FIG. 3 is a block diagram of a configuration in an equipment enclosure as in FIG. 2. Referring to FIGS. 2 and 3, enclosures 110 vary in size and may take the form of a small cabinet up to human accessible rooms having rows of equipment. A typical communications equipment enclosure or shelter is disposed at the base of the tower or antennas it supports, and is large enough to accommodate one or 2 technicians for limited access to the equipment therein. Depending on the size, and therefore the cooling demand, multiple compressors 136-N may be used for redundancy and/or increased thermal response. The multiple compressors 156-N may have an integrated native control, or may operate separately at different ranges of temperature to implement a "phase in" as demand increases. It is, however, often desirable to commonly manage multiple cooling resources for load sharing to prevent unbalanced usage, and thus wear, on the compressor, such as a compressor with a lower turn-on temperature set point that is always to be invoked first.

For example, the native control 130 may include a plurality of independently switchable compressors 136, and suspending operation includes identifying a power cycle count and an elapsed time count for each of the plurality of compressors, and alternating enablement of each compressor of the plurality of compressors 136 for achieving an even distribution of operational time and/or cycling. This ensures that switching and override of the native control 130 as described herein will not resort to always restarting the same compressor, 136, resulting in an uneven load, but will instead distribute the burden evenly.

Continuing to refer to FIG. 3, the controller 150 is responsive to a management station 153, such as a separate controller, laptop, PC or server having control software/firmware, data storage, and programs for receiving, analyzing, and responding to sensor data (thermistors, humidity sensors, switches, etc.) and control objects such as the compressors, fans, louvers and gates in the enclosure 112. A GUI 155 (Graphical User Interface) provides an interactive operator with settings and controls for examining and updating system parameters such as temperature thresholds (set points) and timeouts that affect operation of the air exchange logic 152.

The controller 150 may be a server, integrated circuit, firmware or other suitable processing device for implementing the air exchange logic. The controller 150 includes an override timer 182 and a takeback timer 184 for implementing the respective intervals for inhibiting and enabling the compressors 136. The timers 182, 184 may be implemented as hardware or software registers, firmware values or other suitable implementation.

Each compressor 136-1 . . . 136-N (136 generally) has one or more thermostats 138-1 . . . 138-N for sensing temperatures in the machine room 112, and interfaces with the controller 150 via the interface 160 and feedback indicator 161. In the example configuration, the interface 160 opens and closes a thermostat circuit to which the compressor 136 responds, although other mechanisms for enabling and inhibiting (suppressing) compressor operation may be invoked. The feedback indicator 161 indicates when each compressor 138-N is commanded to an "on" state by the native control, and is used to track power cycles and uptime.

In certain configurations, the machine room 112 employs a plurality of temperature sensors (such as thermistors) 151 for each installation or controller 150. Placement and readings from the sensors 152 include invoking the ambient air circulation fan 154 for obtaining a true reading from an ambient air temperature sensor disposed adjacent to the ambient air circulation fan 154, to provide a true reading without requiring exterior mounting. The air exchange logic 152 then employs a lowest reading from among each sensor 151 of a plurality of interior temperature sensors for initiating the ambient air circulation for cooling the enclosure, based on a sensed ambient temperature and a sensed enclosure temperature obtained from the plurality of sensors, and employs a highest reading from among each sensor of a plurality of interior sensors for halting the ambient air circulation, for ensuring an inaccurate sensor reading is ignored. Strategic placement of sensors 151 to cover range variations in temperature assures that an accurate reading of environmental conditions in the enclosure 110 is computed by the air exchange logic 152.

Sensor information such as temperature, humidity and airflow therefore derives from the temperature or other sensors placed in the conditioned space and outside of the enclosure to determine a delta or difference to help identify expected changes in the conditioned space will result from exchange with the outside air. Placement of exterior sensors is sensitive to solar load and shifting with shadows due to solar movement, wind, and snow/icing conditions, which can vary based on exterior exposure to sun and wind.

In an example arrangement, sensor or thermistor 151 readings for determining adequate temperatures are defined by a range between a maximum set point and a minimum set point, and monitoring includes a measurement of an interior temperature inside the machine room, a measurement of exterior temperature of ambient air outside the machine room 112, and a correction interval such as the override timer for permitting the native control to remain idle.

In the example configuration identifying the power cycle and elapsed time includes interfacing with the thermostatic circuit for determining enablement of the compressors, and receiving a rectified signal over a single conductor from a plurality of thermostatic switches for identifying which thermostatic circuits are enabling the respective compressors. A single conductor and signal may be employed by connecting a rectifier 165-1 . . . 165-N to an energized conductor from the thermostat 138, and varying the rectification (half wave, quarter wave, etc.) for each compressor 136. In a typical installation, the native HVAC system (native control) 130 operates on a 24 VAC thermostatic circuit. Identifying the power cycle and elapsed time includes interfacing with a thermostatic circuit for determining enablement of the compressors, as the thermostat 138 return line will only register 24 VAC when energized. Rectifiers 165 connected between the thermostat 138 return line and the controller 150 receive a rectified signal over a single conductor from a plurality of thermostatic switches 138 for identifying which thermostatic circuits are enabling the respective compressors 136. The rectified connection has a varying response based on the thermostatic circuit The rectified signals will aggregate such that multiple compressor "on" signals generate different wave forms depending on which compressors are powered on, and the controller 150 reads the individual, aggregate signal on the feedback indicator 161 to ascertain compressor operation.

The intake vent 156 and exhaust (output) vent 158 may be louvers, gates, or closures responsive to the controller 150. Each of the vents 156, 158 should remain closed when ambient air exchange is not occurring, to avoid loss of cooled air and for conformance with fire suppression regulations. Multiple vents may be employed. In a particular configuration, the vents 156, 158 have a counterbalanced panel closure such as that disclosed in co-pending U.S. patent application Ser. No. 14/946,182, now U.S. Pat. No. 10,098,255, incorporated herein by reference.

Temperature sensors 151-1 . . . 151-N may be for sensing interior or exterior temperature, and may vary in number to account for so-called "hot spots" which offer skewed or erratic readings. For example, an exterior thermistor in direct sunlight will tend to read a higher than actual temperature. Similarly, an interior thermistor closer to the path of cooled air may give an artificially reduced reading then the machine room 112 as a whole.

Accordingly, the air exchange logic 152 employs a plurality of thermistors 151 (or other temperature sensing device) for each compressor 136 in the native control 130. The air exchange logic 151 may invoke the ambient air circulation fan 133 for obtaining a true reading from an ambient air thermistor disposed adjacent to the ambient air circulation fan 133, as thermistor 151 placement adjacent to (or within) the intake vent 156 avoids wiring outside of the enclosure 110 for external thermistors.

Such placement may be, for example, inside the fan tray of the intake fan, which is beneficial for at least 2 reasons: 1) Accuracy of measurement. The outside air temp thermistor can influenced by solar loading and radiated heat (off the building, door &/or adjacent equipment) so it can be moved inside the fan tray to minimize these influences; and 2) Ease of installation. The outside air temperature sensor can now be factory installed and it is no longer necessary to drill holes in the shelter to place it, or to be concerned with inconsistent placement by different installers.

When multiple temperature sensors are used, the air exchange logic may employ a lowest reading from among each sensor of a plurality of interior sensors for initiating the ambient air circulation for cooling the enclosure. Similarly, it may employ the highest reading from among each sensor of a plurality of interior sensors for halting the ambient air circulation, for ensuring an inaccurate sensor reading is ignored. Similar placement considerations and reading applies to the exterior temperature readings.

Figure 4A:
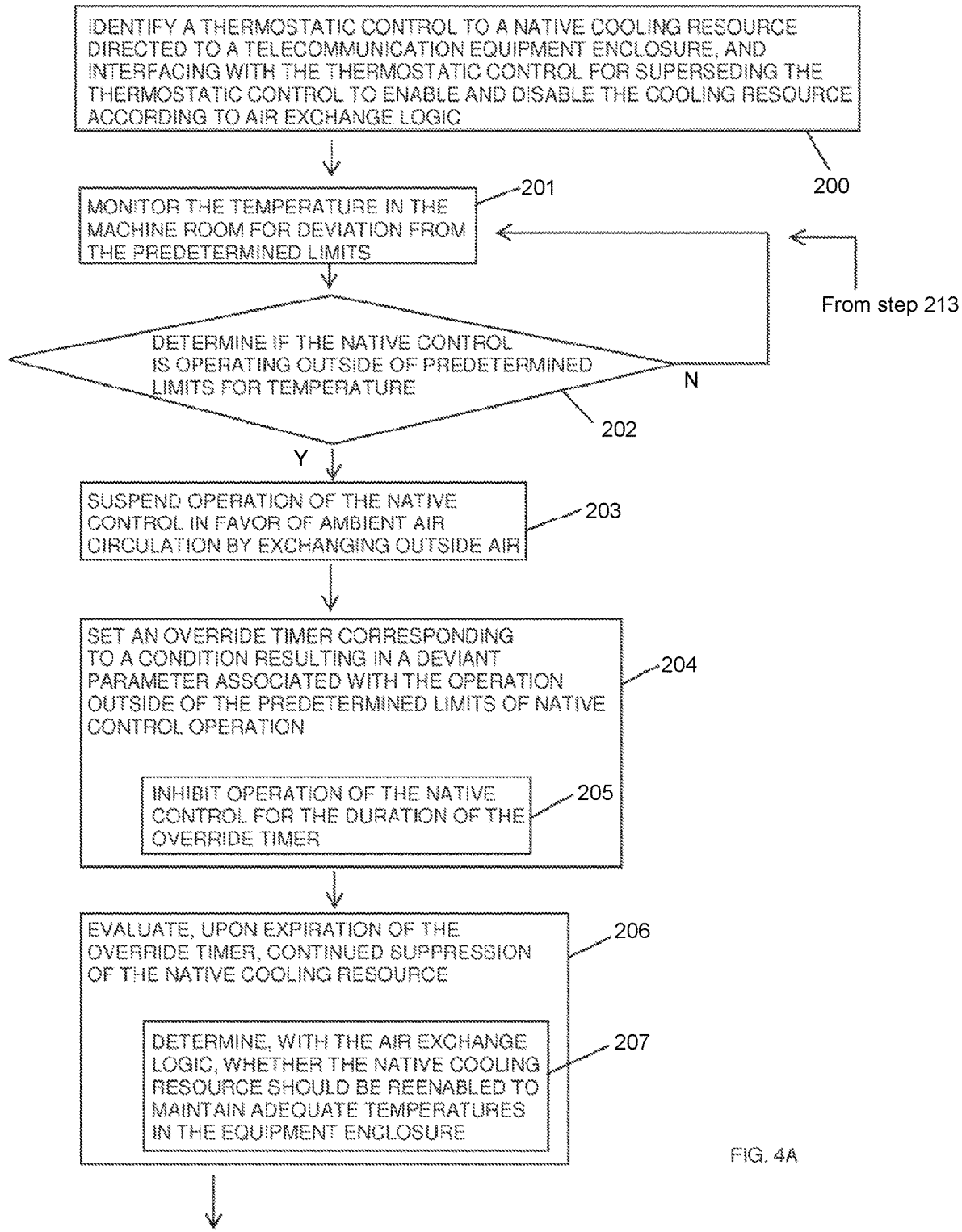
FIGS. 4A and 4B are a flowchart of operation of a management circuit and application in the equipment enclosure of FIG. 3.
Figure 4B:
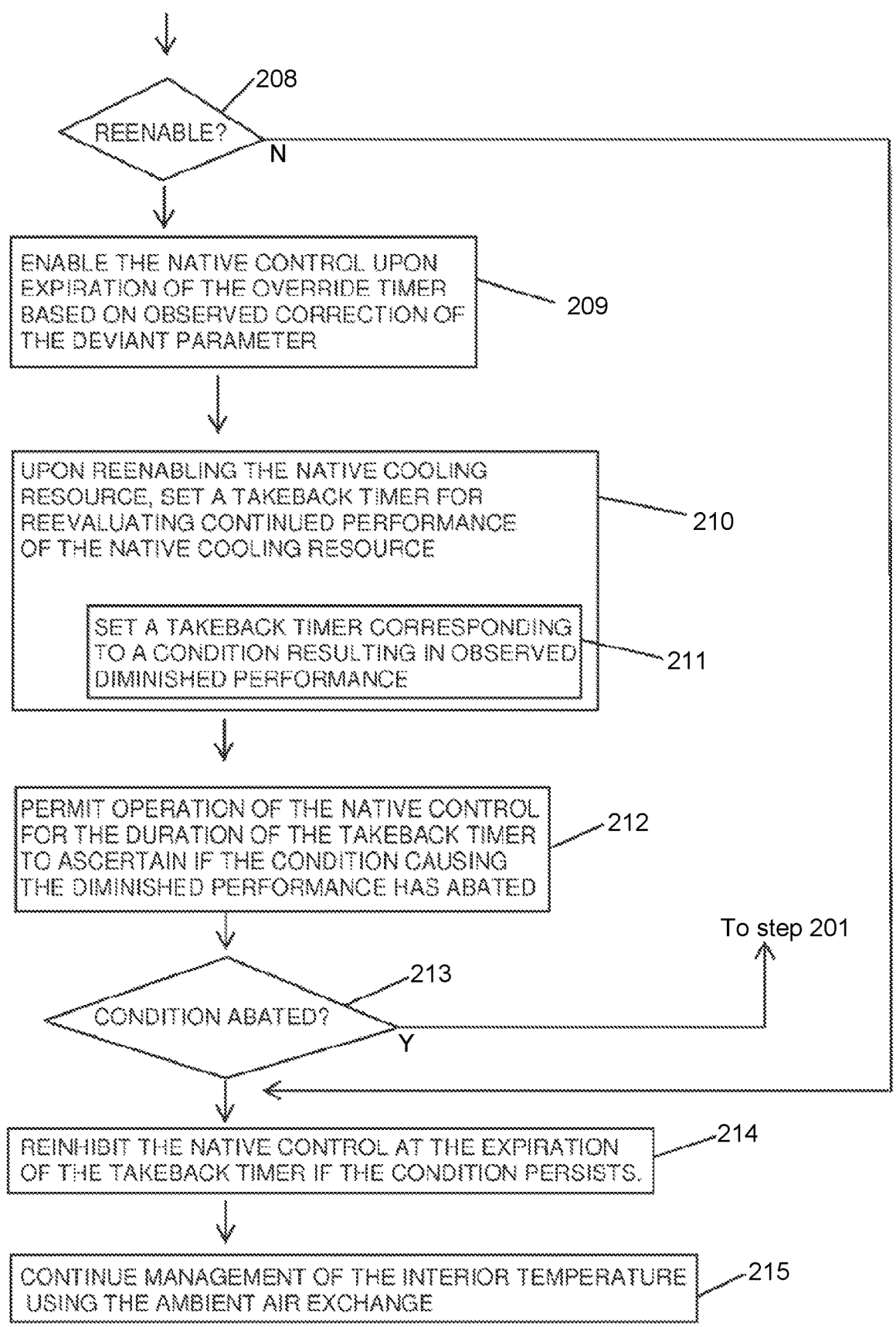

FIG. 4 is a flowchart of operation of a management circuit and application in the equipment enclosure of FIG. 3. Referring to FIGS. 3 and 4, the disclosed method of managing cooling resources or a compressor 136 for cooling electronic equipment 120 includes identifying a thermostatic control 138 to a native cooling resource, such as a compressor 136, directed to a telecommunication equipment enclosure 110, and interfacing with the thermostatic control 138 for superseding the thermostatic control 138 to enable and disable the cooling resource according to air exchange logic 152, as disclosed at step 200. The thermostatic control 138 may be a conventional 24v on/off circuit, or may be part of a more elaborate demand computation. The air exchange logic 152 monitors the temperature in the machine room 112 for deviation from the predetermined limits, as depicted at step 201. The predetermined limits include temperature, as measured by sensors (such as thermistors) 151, and may also include other factors such as humidistats for humidity or any suitable environmental aspect.

In a particular example, predetermined limits encompass temperature, and include identifying a high set point defining a temperature at which the native control is invoked for cooling the machine room, and identifying a low set point defining a temperature at which the native control is disabled. The high set point and low set point therefore identify a range of operation included in the predetermined limits for ambient air circulation in favor of native control.

The air exchange logic 152 determines when the native control of the HVAC system 130 is operating outside of predetermined limits for temperature, as shown at step 202 and the air exchange logic 152 suspends operation of the native control in favor of ambient air circulation by exchanging outside air, as depicted at step 203. If the native control is operating within the predetermined limits, control reverts to step 201 for continued monitoring.

In particular configurations, concluding the capability of the native control further includes comparing the temperature of ambient air outside the machine room 112 with a maximum interior temperature, and determining that ambient air circulation provides insufficient cooling capacity, resulting in a switch over from ambient air circulation back over to the native control 130.

However, an improperly sized native control 130 may result in an overcooling situation. In such an instance, determining when the native control is outside the predetermined limits includes comparing the temperature of the machine room 112 resulting from the native control 130 to a minimum interior temperature, and determining a cooling effect from the native control is in excess of a need for maintaining the minimum interior temperature because of bringing the machine room 112 temperature down too quickly.

The air exchange logic 152 sets an override timer 182 corresponding to a condition resulting in a deviant parameter associated with the operation outside of the predetermined limits of native control operation, as shown at step 204. In response, the air exchange logic inhibits operation of the native control for the duration of the override timer 182, as depicted at step 205. The override timer 182 is set to allow temporary conditions such as excessive backpressure in the compressor 136 or coil freezing to abate, and in a typical scenario may be in the range of 3-30 minutes, although any suitable value may be used. Some fault conditions exacerbate from attempted continued operation, and require only an idle period of the native control for self-correction. Otherwise, in the absence of the inhibit mode disclosed herein, the fault condition would persist and compromise the equipment 120 or the ability to control the environment of the enclosure 110.

Using the example above, the air exchange logic 152 may identify a short cycling and overcooling condition in the enclosure based on a plurality of occurrences of operation outside of the predetermined limits for temperature. The air exchange logic 152 sets the override timer 182 based on a duration for allowing ambient air circulation to maintain the temperature in the enclosure 110 below a maximum set point without power cycling a compressor in the native control. The predetermined limits such as temperature also pertain to environmental conditions in the enclosure and the deviant parameter includes at least one of excessively cold or hot interior temperature, excessive humidity, airflow or excessive cycling of a refrigerant compressor of the native control.

For example, the air exchange logic performs a hysteresis analysis of power cycles and elapsed time during each power cycle of the compressors, and may conclude that a short cycling pattern is causing operation outside of the predetermined limits by a disproportionate cooling effect from the elapsed time. The native AC unit may be oversized and is rapidly bringing down the temperature in a short time without proper dehumidification. In such an instance, the air exchange logic inhibits operation of the native control for extending a cycle time without significant deviation from the predetermined limits of temperature. This allows ambient air exchange until a temperature set point just short of an excessive level, thus resulting in longer cycle times.

The air exchange logic 152 evaluates, upon expiration of the override timer 182, continued suppression of the native cooling resource 130, as depicted at step 206. This includes determining, with the air exchange logic 152, whether the native cooling resource 130 should be re-enabled to maintain adequate temperatures in the equipment enclosure 110, as shown at step 207. A check is performed, at step 208, and the air exchange logic 152 re-enables the native control 130 upon expiration of the override timer 182 based on observed correction of the deviant parameter that resulted in operation outside the predetermined temperate range or other environmental conditions, as disclosed at step 209. If the condition has not abated, ambient air management is used to mitigate excessive temperatures, as discussed below with respect to step 214.

Upon re-enabling the native cooling resource 130, the air exchange logic 152 sets a takeback timer 184 for reevaluating continued performance of the native cooling resource 130, as disclosed at step 210. This includes setting the takeback timer 184 corresponding to a condition resulting in observed diminished performance, as depicted at step 211. Conditions resulting in diminished performance and/or deviant parameters include excessive cooling causing increased humidity, such as a short interval of cooling that drops the temperature but fails to condense moisture from the air. The air exchange logic 152 permits operation of the native control for the duration of the takeback timer 184 to ascertain if the condition causing the diminished performance has abated, as depicted at step 213.

A check is performed, at step 213, to identify if the condition has abated and if the system is again operating within normal parameters. If so, control reverts to step 201 for continued monitoring in a supervisor state, in which the air exchange logic 152 monitors but does not intervene in native control 130 operation.

If the check at step 213 did not indicate correction, then the air exchange logic 152 re-inhibits the native control 130 at the expiration of the takeback timer 184 if the condition persists as depicted at step 214, and continues management of the interior temperature using the ambient air exchange for preventing hardware overhearing, as disclosed at step 215. Ambient air exchange can effectively provide sufficient cooling depending on the differential between ambient (outside) air and the machine room 112 temperature resulting from equipment generated heat. Various alarms and notifications are also generated to alert monitoring personnel or equipment, and continued increased heat may result in equipment 120 shutdown to prevent damage.

Several example use cases of operational scenarios are as follows. When the fans are running, the outside air stream temperature can be sampled continuously. When the fans aren't running [such as when the HVACs are running or when the air temperature inside is below either a. an air conditioner maximum cooling threshold (the low end of the control range where the HVACs are re-inhibited) or b. the air conditioner On temperature threshold] the outside air is sampled periodically by running the fans for a brief period (long enough to allow the temperature sensor to respond and settle at a temperature reading that more accurately reflects the outside air temperature). Samples are also taken when mode changes occur (such as switching to/from Aircon mode or Aircon Too Cool mode or Direct Air mode). A "freshness" metric avoids unnecessary sampling if the last sample was taken recently enough to be valid for control purposes. Logic to suspend sampling when the inside air temp drops below the fan On temp threshold is also implemented. In this way, the inside temperature will not be driven even lower by sampling outside air periodically when outside air temperatures are low (recall that the fans turn on at low speed when sampling and that could drop inside the inside temperature if it is really cold outside and the heat load inside is too low to warm the inflow of the cold air sufficiently).

Alternate configurations of the invention include a multiprogramming or multiprocessing computerized device such as a multiprocessor, controller or dedicated computing device or the like configured with software and/or circuitry (e.g., a processor as summarized above) to process any or all of the method operations disclosed herein as embodiments of the invention. Still other embodiments of the invention include software programs such as a Java Virtual Machine and/or an operating system that can operate alone or in conjunction with each other with a multiprocessing computerized device to perform the method embodiment steps and operations summarized above and disclosed in detail below. One such embodiment comprises a computer program product that has a non-transitory computer-readable storage medium including computer program logic encoded as instructions thereon that, when performed in a multiprocessing computerized device having a coupling of a memory and a processor, programs the processor to perform the operations disclosed herein as embodiments of the invention to carry out data access requests. Such arrangements of the invention are typically provided as software, code and/or other data (e.g., data structures) arranged or encoded on a computer readable medium such as an optical medium (e.g., CD-ROM), floppy or hard disk, flash drive or other medium such as firmware or microcode in one or more ROM, RAM or PROM chips, field programmable gate arrays (FPGAs) or as an Application Specific Integrated Circuit (ASIC). The software or firmware or other such configurations can be installed onto the computerized device (e.g., during operating system execution or during environment installation) to cause the computerized device to perform the techniques explained herein as embodiments of the invention.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. In an environmentally controlled equipment space for housing electronic equipment between temperature ranges defined by an activation temperature for enabling a native HVAC (heating, ventilating and air conditioning) resource and a satisfaction temperature for disabling the HVAC resource responsive to a native control, a method of controlling HVAC equipment comprising:

connecting a controller to a thermostatic switch connection for controlling the native HVAC resource, the controller for superseding the thermostatic switch connection to enable and disable the cooling of the native HVAC resource;

receiving, based on a user preference, a value for a first threshold indicative of preferred upper limit of an operating temperature in the equipment space;

receiving, based on a user preference, a value for a second threshold indicative of an opposed preferred limit of an operating temperature in the equipment space, the first threshold and second threshold representing different temperature values for defining a range of operation of the temperature in the equipment space;

enabling the HVAC resource via the thermostatic switch connection in response to determining that the operating temperature in the equipment space has attained the first threshold, the HVAC resource operable to adjust the temperature towards the second threshold on the range of operation; and disabling the HVAC resource via the thermostatic switch connection in response to determining that the operating temperature has traversed the range of operation and attains the second threshold; and re-enabling the HVAC resource in response to determining that the operating temperature has again traversed the range of operation and attained the first threshold for preventing short cycling of the HVAC resource.

2. The method of claim 1 further comprising reenabling the HVAC resource when the operating temperature again attains the first threshold.

3. The method of claim 2 further comprising iterating through a cycle of enabling and disabling the HVAC resource in response to the first threshold and the second threshold to result in the operating temperature progressing along the range of operation in an alternating manner.

4. The method of claim 1 wherein the HVAC resource is operable for cooling to lower the temperature in the equipment space and operable for heating to raise the temperature in the equipment space.

5. The method of claim 1 further comprising defining the first and second thresholds by:
identifying a high threshold defining a temperature at which the HVAC resource is enabled for cooling the equipment space;
identifying a low threshold defining a temperature at which the HVAC resource is disabled, the high threshold and low threshold defining an extended range of operation through which the HVAC resource may operate.

6. The method of claim 1 further comprising defining the first and second thresholds by:
identifying a low threshold defining a temperature at which the HVAC resource is enabled for heating the equipment space;
identifying a high threshold defining a temperature at which the HVAC resource is disabled.

7. The method of claim 1 further comprising suspending operation of the HVAC resource in favor of ambient air circulation by exchanging outside air for maintaining the operating temperature between the first and second thresholds.

8. The method of claim 7 further comprising, upon disabling the HVAC resource, setting an override timer;
evaluating, upon expiration of the override timer, continued suppression of the HVAC resource;
determining, with the air exchange logic, whether the HVAC resource should be re-enabled to maintain adequate temperatures in the equipment space; and
re-enabling the HVAC resource.

9. The method of claim 8 further comprising, upon re-enabling the HVAC resource, setting a takeback timer for reevaluating continued performance of the HVAC resource;
disabling, if a condition resulting in the previous disabling of the HVAC resource persists, the native cooling resource; and
continuing management of the operating temperature using the ambient air exchange.

10. The method of claim 1 further comprising:
identifying, based on a history of enablement of the HVAC equipment, an abnormal period of activation cycles of the HVAC equipment; and
disabling temperature based control of the HVAC resource to inhibit for inhibiting operation of the HVAC resource to mitigate excessive temperatures.

11. The method of claim 10 wherein enabling and disabling the HVAC equipment further comprises activating a low voltage thermostatic control.

12. The method of claim 10 wherein the history of enablement is derived from a plurality of compressors by receiving, from each activated compressor, a rectified signal based on a thermostatic control to each respective compressor, the rectification varied for each compressor in the plurality of compressors for tracking the enablement of the respective compressor.

13. The method of claim 1 wherein the controller performs enabling and disabling of that native HVAC resource by opening and closing an electrical connection previously responsive to a thermostatic switch for electrical switching responsive to temperature.

14. The method of claim 1 wherein enabling the HVAC resource includes closing an electrical circuit for energizing a heating or cooling resource and a fan motor.

15. An HVAC (heating, ventilating and air conditioning) control method, comprising:
identifying, based on a history of enablement of the HVAC equipment, an abnormal period of activation cycles of the HVAC equipment; and
disabling temperature based control for inhibiting operation for mitigation of excessive temperatures;
receiving a value for a first threshold indicative of preferred upper limit of an operating temperature in the equipment space;
receiving a value for a second threshold indicative of an opposed preferred limit of an operating temperature in the equipment space, the first threshold and second threshold representing different temperature values for defining a range of operation of the temperature in the equipment space;
enabling the HVAC resource when the operating temperature in the equipment space attains the first threshold, the HVAC resource operable to adjust the temperature towards the second threshold on the range of operation; and
disabling the HVAC resource when the operating temperature traverses the range of operation and attains the second threshold; and
re-enabling the HVAC resource after the operating temperature has again traversed the range of operation and attained the first threshold for preventing short cycling of the HVAC resource,
wherein the HVAC resource includes a plurality of compressors and the history of enablement is derived from the plurality of compressors by receiving, from each activated compressor, a rectified signal based on a thermostatic control to each respective compressor.

* * * * *